(12) United States Patent
Wong

(10) Patent No.: US 7,996,801 B2
(45) Date of Patent: Aug. 9, 2011

(54) METHODS AND SYSTEMS FOR ON-THE-FLY CHIP VERIFICATION

(75) Inventor: Kelvin Wong, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 392 days.

(21) Appl. No.: 12/188,749

(22) Filed: Aug. 8, 2008

(65) Prior Publication Data

US 2010/0037190 A1    Feb. 11, 2010

(51) Int. Cl.
G06F 17/50    (2006.01)

(52) U.S. Cl. ........................................ 716/106; 716/111

(58) Field of Classification Search .................. 716/4, 5, 716/51, 101, 106, 111
See application file for complete search history.

(56) References Cited

U.S. PATENT DOCUMENTS

| | | | | |
|---|---|---|---|---|
| 4,866,654 A * | 9/1989 | Yamada | | 708/492 |
| 5,425,036 A * | 6/1995 | Liu et al. | | 714/735 |
| 5,583,430 A | 12/1996 | Dinteman | | 324/158.1 |
| 6,389,379 B1 * | 5/2002 | Lin et al. | | 703/14 |
| 6,477,683 B1 * | 11/2002 | Killian et al. | | 716/1 |
| 6,760,888 B2 * | 7/2004 | Killian et al. | | 716/1 |
| 2004/0158788 A1 * | 8/2004 | Kaszynski et al. | | 714/741 |
| 2004/0216061 A1 | 10/2004 | Floyd et al. | | 716/136 |
| 2007/0282556 A1 | 12/2007 | Achkar et al. | | 702/108 |

* cited by examiner

*Primary Examiner* — Sun J Lin
(74) *Attorney, Agent, or Firm* — Randall Bluestone; Roberts Mlotkowski Safran & Cole, P.C.

(57) ABSTRACT

Methods and systems for on-the-fly chip verification method for tracking non-contiguous events. A method includes comparing a first search marker associated with a first check vector to a search key associated with an output vector of a design under test (DUT). The method also includes performing either: verifying a validity of the output vector when the first search marker equals the search key, or comparing a second search marker associated with a second check vector to the search key when the first search marker does not equal the search key.

20 Claims, 3 Drawing Sheets

Where:

$S = \{s_1, s_2, s_3, \ldots, s_n, \ldots s_N\}$ $O = \{o_1, o_2, o_3, \ldots, o_n, \ldots o_N\}$ $V = \{v_1, v_2, v_3, \ldots, v_n, \ldots v_N\}$

METHODS AND SYSTEMS FOR ON-THE-FLY CHIP VERIFICATION

FIELD OF THE INVENTION

The invention generally relates to design verification, and more particularly to methods and systems for on-the-fly chip verification for tracking non-contiguous events.

BACKGROUND

Circuit designs (e.g., for computer hardware) are normally verified before being fabricated. During verification, a design is sometimes referred to as a design under test (DUT). Typically, a DUT is verified by running a simulation program on a computer during which different inputs (called stimuli, inputs, or events) are in turn applied to the DUT, and the signals at the outputs of the DUT are collected and compared with expected values of the design specification. When actual output values of the DUT do not agree with predicted values of the design specification, the circuit design is considered defective and is usually re-designed.

Often times, a particular input to a DUT yields a single, predictable output. For example, input A results in output X, while input B results in output Y. Conventional verification software often very straightforwardly compares a predicted output to the actual output of the DUT as the simulation time advances.

More specifically, a exemplary known environment for verifying a DUT includes the DUT, a stimulus generator, a behavioral model of the DUT, and an output checker. This type of simulation scheme is sometimes known as on-the-fly verification as the outputs of the DUT are checked as they are produced. In this technique, an ordered series of stimulus vectors (e.g., input vectors) is generated by the stimulus generator. The input vectors are fed one-by-one in order simultaneously to the DUT and the behavioral model. For each input vector, the DUT produces an ordered series of output vectors, and the behavioral model produces an ordered series of check vectors.

The function of the output checker is to compare each output vector (e.g., from the DUT) to a corresponding check vector (e.g., from the behavioral model). A first-in-first-out (FIFO) buffer may be used to queue the check vectors, since the behavioral model often generates its vectors faster than the DUT. Whenever the DUT produces an output vector, the next available check vector in the FIFO is dequeued from the FIFO and the two vectors are checked against each other. If the output vector does not equal the check vector, then a simulation error is immediately flagged.

The FIFO is used to compensate for the relative delays between the DUT and behavioral model. Often, the behavioral model is a functionally accurate version of the DUT but does not model any of the real-life delays which will be unavoidable in the real design. Thus when verifying a synchronous design, the behavioral model will typically produce a check vector for every clock cycle it is given a stimulus, and produce it within the same clock cycle. On the other hand, the DUT exhibits timing delays, e.g., due to the presence of latches. As a result, it is often only possible to produce the output vector at a later clock cycle from when a stimulus vector was first received. Thus the FIFO acts to compensate for the speed differential between the behavioral model and the DUT by storing check vectors in order until the corresponding output vector is produced.

The test environment described thus far works well when there is a one-to-one correspondence between the series of check vectors and output vectors (e.g., for each input vector produced by the stimulus generator and input to the DUT and BM, one output vector is produced by the DUT and one check vector is produced by the behavioral model). However, a given DUT often does not have sufficient bandwidth to process every stimulus vector it receives. So, for example, given three input vectors (e.g., $S_n$, $S_{n+1}$, $S_{n+2}$) the DUT may process $s_n$ to produce a first output vector. However, in some circumstances the DUT ignores the second input vector $s_{n+1}$ due to lack of bandwidth because it is busy processing $s_n$. Then, when the next stimulus vector $s_{n+2}$ arrives at a sufficient later time, the DUT produces a second output vector.

Meanwhile the behavioral model produces first, second, and third check vectors from the same three input vectors (e.g., $s_n$, $s_{n+1}$, $s_{n+2}$), respectively, since the behavioral model does not exhibit the same delay as the DUT. Put another way, the behavioral model does not ignore the second input vector. Accordingly, in the on-the-fly test environment described above, the checker will compare the second output vector to the second check vector. However, the second output vector and the second check vector do not correspond to one another because they were produced from different input vectors. Particularly, the second output vector was produced from the third input vector, while the second check vector was produced from the second input vector. Thus, the values of the second output vector to the second check vector most likely will not be equal, and an error will be indicated when the checker compares these two vectors.

An alternative technique for verifying a DUT employs post processing. In this environment, the series of output vectors from the DUT is stored in a memory array. When all input vectors have been submitted to the DUT and processed, the contents of the array are checked to ensure the output behavior was as expected.

However, post-processing techniques can fail to identify anomalous behavior of the DUT. For example, if the function of the DUT is to write data to the memory array, the DUT could, during the simulation, write bad data to the array and then later overwrite that array location with correct data. When post checking of the memory array occurs, the test environment will not detect this anomalous behavior because good data is now in the array.

Moreover, in post-processing techniques, anomalous behavior will not be flagged as it occurs. When the DUT produces an bad (e.g., unexpected) output vector, that output vector is stored in the array and only detected later when post-checking of the array occurs. A simulation log is then examined to discover the exact moment when the bad output vector was produced. Depending upon the size of the log, this can require significant analysis time. With on-the-fly verification, on the other hand, output vectors are checked as soon as they emerge from the DUT, so the simulation can be stopped immediately and the error highlighted.

Another known solution is to generate a more accurate behavioral model of the DUT, e.g., one that models the delays of the real design. However, the person creating the test environment needs intimate knowledge of the DUT design in order to achieve this model. Often this person is not the same person as the actual designer of the DUT, and so this knowledge may not be so readily available. In addition, the model complexity would be greatly increased.

Accordingly, there exists a need in the art to overcome the deficiencies and limitations described hereinabove.

SUMMARY

In a first aspect of the invention, there is a method for chip verification performed using software embodied in a tangible medium. The method comprises comparing a first search marker associated with a first check vector to search key associated with an output vector of a design under test (DUT). The method also comprises performing either: verifying a validity of the output vector when the first search marker equals the search key, or comparing a second search marker associated with a second check vector to the search key when the first search marker does not equal the search key.

In another aspect of the invention, there is a method for verifying a design under test (DUT), the method comprising providing a computer infrastructure that operates to: identify corresponding vectors from a series of output vectors and a series of check vectors; and verify a respective output vector by comparing it to a corresponding check vector.

In another aspect of the invention, there is a system for chip verification, the system comprising: a stimulus generator that produces a series of input vectors; a design under test (DUT) that produces a series of output vectors based upon the series of input vectors; and a behavioral model that produces a series of check vectors based upon the series of input vectors. The system also includes a first-in-first-out (FIFO) buffer arranged to queue portions of the series of check vectors; a comparator arranged to identify corresponding vectors from the series of output vectors and the series of check vectors; and a checker arranged to verify the corresponding vectors.

In another aspect of the invention, a computer program product comprises a computer usable medium having a computer readable program embodied in the medium. The computer readable program, when executed on a computing device, causes the computing device to: determine when an output vector has been produced by a design under test (DUT); de-queue a first check vector at a front of a first-in-first-out (FIFO) buffer; and compare a first search marker in the first check vector to a search key in the output vector. When the first search marker does not equal the search key, one of the following is performed: (i) de-queue a second check vector from the FIFO buffer and compare a second search marker in the second check vector to the search key in the output vector, or (ii) fail the DUT. On the other hand, when the first search marker equals the search key, the entire first check vector is compared to the entire output vector.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to design verification, and more particularly to methods and systems for on-the-fly chip verification method for tracking non-contiguous events. In embodiments of the invention, the FIFO in an on-the-fly verification environment is modified with a look-ahead function and includes embedding a different marker within each input vector of the stimulus generator. This marker will create a unique signature in the respective output and check vectors when they are produced by the DUT and behavioral model.

For example, when an output vector is produced by the DUT, its signature is compared to that of the check vector at the front of the FIFO. If the signatures match, then the output vector and check vector correspond (e.g., were made based upon the same input vector), and the output vector and check vector are then compared for verification. However, if the signatures of the output vector and check vector do not match, then it is inferred that the output vector and check vector do not correspond, and the FIFO is searched until a check vector is found which has the same signature as the output vector. If no FIFO entry with a matching signature is found, then the test (e.g., the DUT) is indicated as failed.

Accordingly, implementations of the invention allow on-the-fly verification to be used when the series of output vector and check vector no longer have a one-to-one correspondence. Moreover, the use of post-processing verification is avoided. In addition, the creation of the behavioral model does not require intimate knowledge of the actual design; rather, it can be based purely from the design specification.

Figure 1:
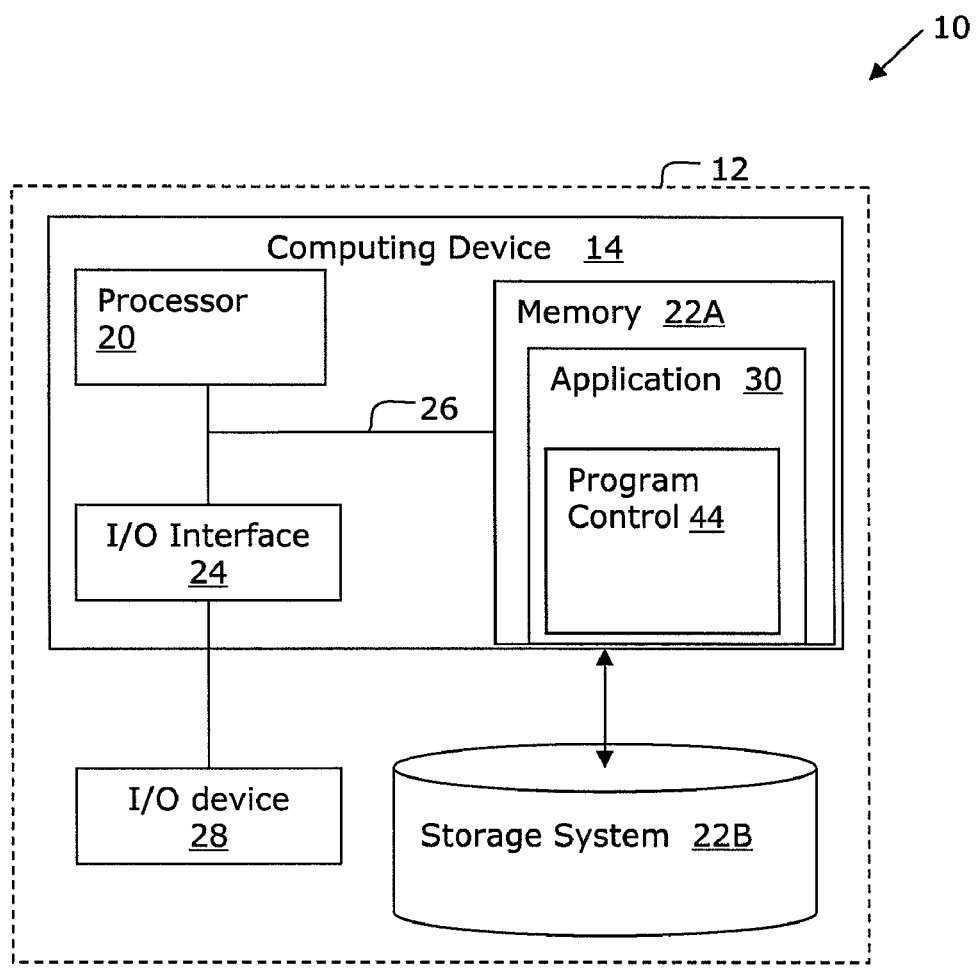
FIG. 1 shows an illustrative environment for implementing the steps in accordance with the invention.

FIG. 1 shows an illustrative environment 10 for managing the processes in accordance with the invention. To this extent, the environment 10 includes a computer infrastructure 12 that can perform the processes described herein. In particular, the computer infrastructure 12 includes a computing device 14 that comprises an application 30 having a program control 44, which makes the computing device 14 operable to perform the processes described herein, such as, for example, performing on-the-fly verification of a DUT.

The computing device 14 includes a processor 20, a memory 22A, an input/output (I/O) interface 24, and a bus 26. The memory 22A can include local memory employed during actual execution of program code, bulk storage, and cache memories which provide temporary storage of at least some program code (e.g., program control 44) in order to reduce the number of times code must be retrieved from bulk storage during execution. Further, the computing device 14 is in communication with an external I/O device/resource 28 and a storage system 22B. The I/O device 28 can comprise any device that enables an individual to interact with the computing device 14 or any device that enables the computing device 14 to communicate with one or more other computing devices using any type of communications link. The external I/O device/resource 28 may be keyboards, displays, pointing devices, etc.

The processor 20 executes computer program code (e.g., program control 44), which is stored in memory 22A and/or storage system 22B. While executing computer program code, the processor 20 can read and/or write data to/from memory 22A, storage system 22B, and/or I/O interface 24. The bus 26 provides a communications link between each of the components in the computing device 14.

The computing device 14 can comprise any general purpose computing article of manufacture capable of executing computer program code installed thereon (e.g., a personal computer, server, wireless notebook, smart phone, personal digital assistant, etc.). However, it is understood that the computing device 14 is only representative of various possible equivalent computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 12 is only illustrative of various types of computer infrastructures for implementing the invention. For example, in embodiments, the computer infrastructure 12 comprises two or more computing devices (e.g., a server cluster) that communicate over any type of communications link, such as a network, a shared memory, or the like, to perform the processes described herein. Further, while performing the processes described herein, one or more computing devices in the computer infrastructure 12 can communicate with one or more other computing devices external to computer infrastructure 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

In embodiments, the invention provides a business method that performs the steps of the invention on a subscription, advertising, and/or fee basis. That is, a service provider, such as a Solution Integrator, could offer to perform the processes described herein, such as, for example, performing on-the-fly verification of a DUT. In this case, the service provider can create, maintain, deploy, support, etc., a computer infrastructure that performs the process steps of the invention for one or more customers. In return, the service provider can receive payment from the customer(s) under a subscription and/or fee agreement and/or the service provider can receive payment from the sale of advertising content to one or more third parties.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires; a portable computer diskette; a hard disk; a random access memory (RAM); a read-only memory (ROM); an erasable programmable read-only memory (EPROM or Flash memory); an optical fiber; a portable compact disc read-only memory (CDROM); an optical storage device; and/or a transmission media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network. This may include, for example, a local area network (LAN) or a wide area network (WAN), or the connection may be made to an external computer (for example, through the Internet using an Internet Service Provider).

Figure 2:
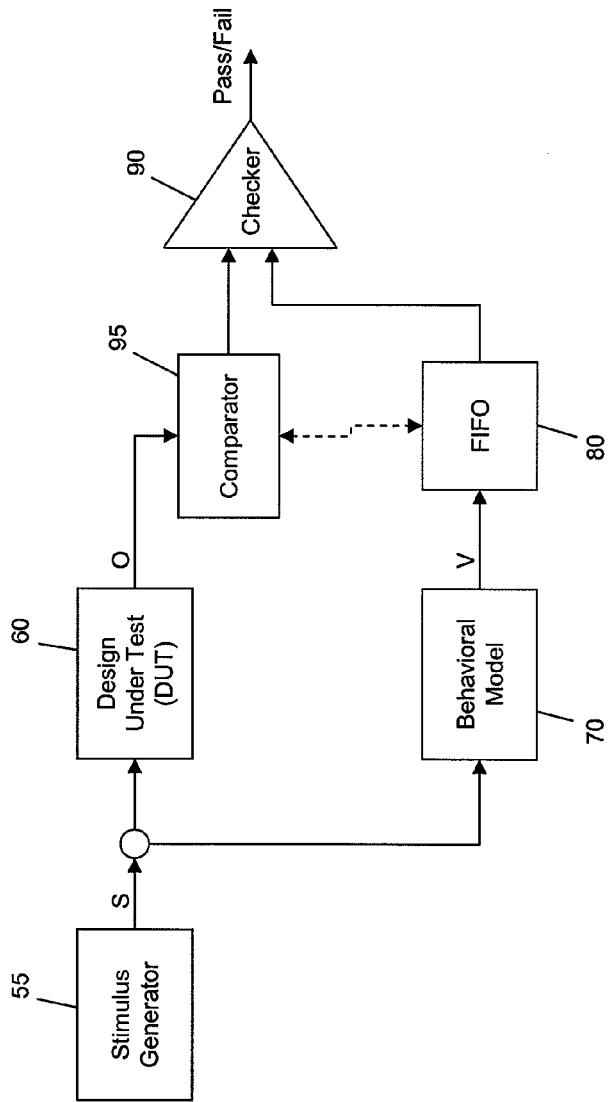
FIG. 2 shows a block diagram according to aspects of the invention.

FIG. 2 shows a block diagram of a system for testing a DUT in accordance with embodiments of the invention. The block diagram in the Figure illustrates the architecture, functionality, and operation of possible implementations of systems, methods and computer program products according to various embodiments of the present invention. In this regard, each block in the block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagram, and combinations of the blocks can be implemented by special purpose hardware-based systems that perform the specified functions or acts, or combinations of special purpose hardware and computer instructions and/or software, as described above.

In embodiments, the system includes a stimulus generator 55 that generates an ordered series S of stimulus vector (e.g., input vectors), where $$S=\{s_1, s_2, s_3, \ldots, s_n, \ldots s_N\}$$

where $s_n$ is $n^{th}$ input vector in the series S, and N is total the number of input vectors in the series S (e.g., the total number of input vectors produced by the stimulus generator 55 during a verification run).

In embodiments, the individual input vectors of series S are fed one-by-one in order simultaneously to a design under test (DUT) 60 and a behavioral model 70. For each individual input vector of series S, the behavioral model 70 produces an ordered series V of check vectors, where:

$$V=\{v_1, v_2, v_3, \ldots, v_n, \ldots, v_N\}$$

where $v_n$ is $n^{th}$ input vector in the series V, and N is total the number of check vectors in the series V. The DUT 60 also produces a series 0 of vectors based upon the individual input vector of series S, where:

$$O=\{o_1, o_2, o_3, \ldots, o_n, \ldots, o_N\}.$$

In embodiments, the system also includes a FIFO 80, a checker 90, and a comparator 95. The FIFO 80 queues check vectors of the series V, while the checker 90 compares individual check vectors $v_n$ to individual output vectors $o_n$ produced by the DUT 60. The comparator 95 operates to identify corresponding output and check vectors, as described in greater detail below. According to aspects of the invention, the stimulus generator 55, the DUT 60, the behavioral model 70, the FIFO 80, the checker 90, and the comparator 95 may be implemented using any suitable combination of software and hardware, such as, for example, one or more applications 30 described above with respect to FIG. 1. Moreover, the DUT 60 may be representative of any design for which verification is desired, including, but not limited to, the design of a digital circuit which has been described in some kind of hardware description language (e.g., VHDL, Verilog, etc.).

According to aspects of the invention, the check vector $v_n$ (e.g., produced from the behavioral model 70) is the expected output of the DUT 60 when input vector $s_n$ is applied to the DUT 60, and the output vector $o_n$ is the actual output when $s_n$ is applied to the DUT 60. If $o_n = v_n$ for all n where $1 \leq n \leq N$, then the DUT 60 behaves as expected and the simulation will pass the verification.

According to aspects of the invention, each input vector $s_n$, output vector $o_n$, and check vector $v_n$ is represented in its constituent parts:

$$s_n = \{\alpha_{1,n}, \alpha_{2,n}, \ldots, \alpha_{m,n}, \ldots, \alpha_{M,n}\};$$

$$o_n = \{\beta_{1,n}, \beta_{2,n}, \ldots, \beta_{m,n}, \ldots, \beta_{M,n}\}; \text{ and}$$

$$v_n = \{\chi_{1,n}, \chi_{2,n}, \ldots, \chi_{m,n}, \ldots, \chi_{M,n}\},$$

where $\alpha_{m,n}$ is the $m^{th}$ element of $s_n$, $\beta_{m,n}$ is the $m^{th}$ element of $o_n$, and $\chi_{m,n}$ is the $m^{th}$ element of $v_n$. The behavioral model 70 transforms a stimulus vector $s_n$ to a check vector $v_n$. This transform can be represented as a function, F such that:

$$v_n = F(s_n)$$

In embodiments, the function F is broken down into sub-functions, $f_m$, which transform each of the elements of $s_n$ as follows:

$$v_n = F(\{\alpha_{1,n}, \alpha_{2,n}, \ldots, \alpha_{m,n}, \ldots, \alpha_{M,n}\});$$

$$\rightarrow v_n = \{f_1(\alpha_{1,n}), f_2(\alpha_{2,n}), \ldots, f_m(\alpha_{m,n}), \ldots, f_M(\alpha_{M,n})\};$$

$$\rightarrow v_n = \{\chi_{1,n}, \chi_{2,n}, \ldots, \chi_{m,n}, \ldots, \chi_{M,n}\}.$$

According to aspects of the invention, the elements of the input vector (e.g., $\alpha_{m,n}$) and/or the function F are appropriately defined and programmed (e.g., into the stimulus generator 55 and the behavioral model 70, respectively) such that a sub-function $f_m$ operating on $\alpha_{m,n}$ produces a value of $\chi_{m,n}$ such that for all p in the range of $1 \leq p \leq N$ (excluding when p=n), $\chi_{m,p}$ does not equal $\chi_{m,n}$. Put another way, the $m^{th}$ element of the check vector $v_n$ is different from every other $m^{th}$ element all other check vectors in the series V. This can be expressed as:

$$(\forall p: 1 \leq p \leq N; p \neq n: \chi_{m,p} \neq \chi_{m,n}).$$

As such, $\chi_{m,n}$ of the check vector $v_n$ is used as a unique search marker, and the element $\beta_{m,n}$ of the output vector $o_n$ is used as a search key when looking ahead through the FIFO 80. Since $\chi_{m,f}$ is unique across the $m^{th}$ members of all check vectors in the series V, if $\beta_{m,n}$ equals $\chi_{m,f}$ then it is inferred that the vectors $v_f$ and $o_n$ were produced from the same input vector (e.g., the vectors $v_f$ and $o_n$ correspond to one another). In embodiments, the comparator 95 identifies corresponding output and check vectors by comparing $\beta_{m,n}$ and $\chi_{m,f}$ and by looking ahead in the FIFO, if necessary. When corresponding vectors are identified, $v_f$ can be used to accurately perform on-the-fly verification of $o_n$ by using the checker 90 to compare the entire vectors $v_f$ and $o_n$ to one another.

In embodiments, to make searching the FIFO 80 more expedient, the sub-function $f_m$ is arranged such that calculating $f_m(\alpha_{m,n})$ can be done with a minimum of computing resource. However, in some applications, it may not be possible to identify a single function $f_m$ that, when operating on $\alpha_{m,n}$, produces unique values of $\chi_{m,n}$ across all vectors in the series V. Accordingly, in further aspects of the invention, two (or perhaps more) sub-functions (e.g., $f_m$ and $f_q$) may be used to create a unique signature in the check vector. For example, two sub-functions (e.g., $f_m$ and $f_q$) may be defined and programmed into the behavioral model 70 such that the results, $\chi_{m,n}$ and $\chi_{q,n}$, when concatenated together form a unique marker within the vectors of series V. In the limiting case, the entire vector $v_n$ may act as a unique marker.

Figure 3:
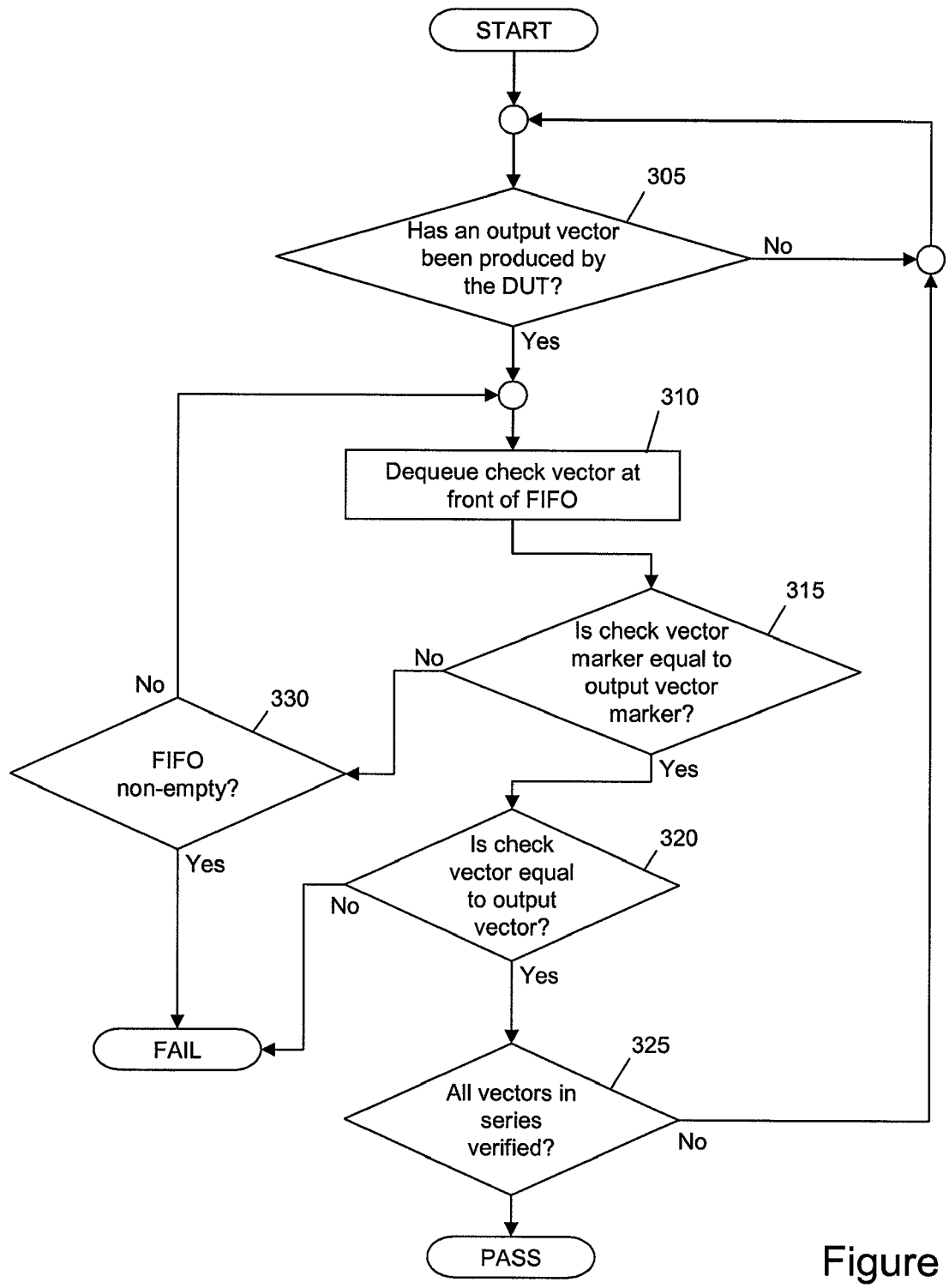
FIG. 3 shows a flow diagram depicting implementations of a method according to aspects of the invention.

FIG. 3 shows a flow diagram depicting implementations of a method according to aspects of the invention. The steps of the flow diagrams described herein may be implemented in the environment of FIG. 1 and/or 2. The flow diagrams may equally represent a high-level block diagram of the invention. The steps of the flow diagrams may be implemented and executed from a server, in a client-server relationship, by computing devices in an ad hoc network, or they may run on a user workstation with operative information conveyed to the user workstation. Additionally, the invention can take the form of an entirely hardware embodiment, an entirely software embodiment or an embodiment containing both hardware and software elements. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. The software and/or computer program product can be implemented in the environments of FIGS. 1 and/or 2. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

Referring to FIG. 3, at step 305, a verification program (such as, for example, application 30) determines if an output vector (e.g., $o_n$) has been produced by the DUT (e.g., DUT 60). If the determination is negative, then the process loops back to step 305 to continue checking for an output vector from the DUT. When an output vector is found at step 305, then at step 310 the verification program de-queues the next check vector (e.g., $v_f$) at the front of the FIFO (e.g., FIFO 80).

At step 315, the verification program determines whether the check vector marker (e.g., signature) is equal to the output vector marker. Put another way, the verification program determines whether $\beta_{m,n}$ equals $\chi_{m,f}$. If the markers $\beta_{m,n}$ and $\chi_{m,f}$ are equal, then it is inferred that the vectors (e.g., $o_n$ and $v_f$) correspond (e.g., were made from the same input vector). In this case, the process proceeds to step 320, where the verification program determines whether the corresponding vectors (e.g., $o_n$ and $v_f$) are equal (e.g., using checker 90).

If, at step 320, the corresponding vectors are not equal, then the verification of the design is flagged as failed. However, if at step 320, the corresponding vectors are equal, then the verification process continues by determining whether any vector in the series remain at step 325. If vectors remain in the series, then the process returns to step 305 to wait for another output vector from the DUT. If, at step 320, no other vectors remain, then the verification is deemed to have passed.

If, at step 315, the markers are not equal, then at step 330 the verification program determines whether there are any check vectors remaining in the FIFO. If the FIFO is empty at step 330, then the verification is indicated as failed. However, if the FIFO is not empty at step 330, then the process returns to step 310, where the verification program begins examination of the next check vector in the FIFO.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed:

1. A method for chip verification performed by a computing device using software embodied in a tangible medium installed therein, the method comprising:
   comparing a first search marker associated with a first check vector to a search key associated with an output vector of a design under test (DUT); and
   performing either:
     verifying a validity of the output vector when the first search marker equals the search key, or
     comparing a second search marker associated with a second check vector to the search key when the first search marker does not equal the search key.

2. The method of claim 1, wherein the first check vector is produced by a behavioral model based upon a series of input vectors received from a stimulus generator.

3. The method of claim 2, wherein the output vector is produced by the DUT based upon the series of input vectors received from the stimulus generator.

4. The method of claim 2, wherein the comparing a second search marker associated with a second check vector to the search key when the first search marker does not equal the search key comprises looking ahead in a series of vectors stored in a first-in-first-out (FIFO) buffer.

5. The method of claim 4, wherein the series of vectors stored in the FIFO buffer is a series of check vectors produced by the behavioral model.

6. The method of claim 1, wherein:
   the first search marker is unique to the first check vector in a series of check vectors produced by a behavioral model, and
   the search key is unique to the output vector in a series of output vectors produced by the DUT.

7. The method of claim 6, wherein the first search marker is based upon at least one of:
   values of elements of an input vector from a stimulus generator, and
   sub-functions that transform the elements in producing the first check vector.

8. The method of claim 1, wherein the first search marker comprises a unique element of the first check vector.

9. The method of claim 1, wherein the first search marker comprises a unique concatenation of at least two elements of the first check vector.

10. The method of claim 1, wherein at least one of the steps of claim 1 is performed by a service provider under a subscription and/or fee agreement.

11. The method of claim 1, wherein a service provider at least one of creates, maintains, deploys, and supports a computer infrastructure that performs at least one of the steps of claim 1.

12. A method for verifying a design under test (DUT), the method comprising providing a computer infrastructure to perform the following steps:
   identifying a search marker associated with a check vector and a search key associated with an output vector of the DUT;
   identifying corresponding vectors from a series of output vectors associated with the DUT and a series of check vectors based on a comparison of the search marker and the search key; and
   verifying a respective output vector by comparing it to a corresponding check vector.

13. A method for verifying a design under test (DUT), the method comprising providing a computer infrastructure to perform the following steps:
   identifying corresponding vectors from a series of output vectors associated with the DUT and a series of check vectors; and
   verifying a respective output vector by comparing it to a corresponding check vector,
   wherein the identifying comprises comparing an $m^{th}$ value of a first check vector produced by a behavioral model to an $m^{th}$ value of a first output vector produced by the DUT.

14. The method of claim 13, wherein the $m^{th}$ value of the first check vector is unique compared to an $m^{th}$ value of each check vector of the series of check vectors.

15. A system for chip verification, the system comprising:
   a stimulus generator that produces a series of input vectors;
   a design under test (DUT) that produces a series of output vectors based upon the series of input vectors;
   a behavioral model that produces a series of check vectors based upon the series of input vectors;
   a first-in-first-out (FIFO) buffer arranged to queue portions of the series of check vectors;
   a comparator arranged to identify corresponding vectors from the series of output vectors and the series of check vectors from the FIFO buffer; and
   a checker arranged to verify the corresponding vectors.

16. The system of claim 15, wherein the comparator identifies the corresponding vectors by comparing a search marker of a check vector to a search key of an output vector.

17. The system of claim 16, wherein:
- each check vector in the series of check vectors has a unique search marker, and
- each output vector in the series of output vectors has a unique search key.

18. The system of claim 15, wherein at least one of the stimulus generator, the DUT, the behavioral model, the FIFO buffer, the comparator, and the checker are implemented on a computer infrastructure as software embodied in a tangible medium.

19. A computer program product comprising a computer usable medium having a computer readable program embodied therein, wherein the computer readable program, when executed on a computing device, causes the computing device to:
- determine when an output vector has been produced by a design under test (DUT);
- de-queue a first check vector at a front of a first-in-first-out (FIFO) buffer;
- compare a first search marker in the first check vector to a search key in the output vector;
- when the first search marker does not equal the search key, perform one of: (i) de-queue a second check vector from the FIFO buffer and compare a second search marker in the second check vector to the search key in the output vector, or (ii) fail the DUT; and
- when the first search marker equals the search key, compare the entire first check vector to the entire output vector.

20. The computer program product of claim 19, wherein:
- the first check vector and the second check vectors are part of a series of check vectors produced by a behavioral model based upon a series of input vectors received from a stimulus generator,
- the output vector is a part of a series of output vectors produced by the DUT based upon the series of input vectors received from the stimulus generator, and
- the first search marker is unique to the first check vector relative to the series of check vectors.

* * * * *